(12) United States Patent
Kim (10) Patent No.: US 9,159,429 B2
(45) Date of Patent: Oct. 13, 2015

(54) DATA STORAGE SYSTEM AND METHOD OF OPERATING THE SAME

(71) Applicant: SK hynix Inc., Gyeonggi-do (KR)

(72) Inventor: Tae Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 6 days.

(21) Appl. No.: 14/163,762

(22) Filed: Jan. 24, 2014

(65) Prior Publication Data

US 2015/0070996 A1    Mar. 12, 2015

(30) Foreign Application Priority Data

Sep. 10, 2013    (KR) .................... 10-2013-0108568

(51) Int. Cl.
*G11C 16/06* (2006.01)
*G11C 16/10* (2006.01)

(52) U.S. Cl.
CPC ...................................... *G11C 16/10* (2013.01)

(58) Field of Classification Search
CPC ............... G11C 11/5628; G11C 16/10; G11C 16/0483; G11C 11/5642; G11C 16/22; G11C 2211/5646; G11C 11/5621

USPC ............. 365/185.03, 185.12, 185.11, 189.05, 365/226

See application file for complete search history.

(56) References Cited

U.S. PATENT DOCUMENTS

2008/0266948 A1 *  10/2008  Jang et al. ................ 365/185.03

FOREIGN PATENT DOCUMENTS

KR    1020090020995    2/2009

\* cited by examiner

*Primary Examiner* — Thong Q Le
(74) *Attorney, Agent, or Firm* — IP & T Group LLP (57) ABSTRACT

A data storage system and a method of operating the same are provided. The method includes performing a program operation on a first page of the pages of a memory block, deciding, when power is switched on after a sudden power-off is generated while the program operation is performed, whether to skip the program operation on a first erase page of the pages based on a second page on which the program operation is performed subsequent to the first page, and performing the program operation on the second page.

17 Claims, 10 Drawing Sheets

|     |     |     |     |
| --- | --- | --- | --- |
| WL0 | MSB | 4 | 5 |
|     | LSB | 0 | 1 |
| WL1 | MSB | 8 | 9 |
|     | LSB | 2 | 3 |
| WL2 | MSB | 12 | 13 |
|     | LSB | 6 | 7 |
| WL3 | MSB | 16 | 17 |
|     | LSB | 10 | 11 |
| WL4 | MSB | 20 | 21 |
|     | LSB | 14 | 15 |

▨ Program page
▧ Erase page

← Do not skip

DATA STORAGE SYSTEM AND METHOD OF OPERATING THE SAME

CROSS-REFERENCE TO RELATED APPLICATION

The present application claims priority of Korean patent application number 10-2013-0108568, filed on Sep. 10, 2013, in the Korean Intellectual Property Office, the entire disclosure of which is incorporated herein by reference in its entirety.

BACKGROUND

1. Field of Invention

Various embodiments of the present invention relate to an electronic device. More specifically, the present invention relates to a data storage system and a method of operating the same.

2. Description of Related Art

Among data storage devices, semiconductor memory devices are largely classified as volatile memory devices and non-volatile memory devices.

A volatile memory device has a high write and read speed, but when a power supply is cut off, stored data disappears. A non-volatile memory device has a relatively low write and read speed but maintains stored data even when the power supply is cut off. Accordingly, regardless of the power supply, the non-volatile memory device is used in order to maintain the stored data. Non-volatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and so on. Flash memories are classified as NOR-type and NAND-type.

The flash memories have an advantage of a RAM in that programming and erasure of data are free, and an advantage of a ROM in that stored data is maintained. Flash memories are widely used as a storage medium of portable electronic devices such as a digital camera, a PDA (personal digital assistant), and an MP3 player.

It is desirable for semiconductor memory devices to have high data reliability.

BRIEF SUMMARY

The present invention is directed to a data storage system and a method of operating the same having high data reliability.

One aspect of the present invention provides a method of operating a data storage system including: performing a program operation on a first page of pages of a memory block; deciding, when power is switched on after a sudden power-off is generated while the program operation is performed, whether to skip the program operation on a first erase page of the pages based on a second page on which the program operation is performed subsequent to the first page; and performing the program operation on the second page.

The decision whether to skip the program operation on the first erase page may include skipping the program operation on the first erase page, if the second page is an LSB page.

If it is decided to skip the program operation on the first erase page, the method may further include skipping the program operation on the second page, and performing the program operation on a third page on which the program operation is performed subsequent to the second page of the pages.

Another aspect of the present invention provides a data storage system, comprising: a semiconductor device suitable for performing a program operation on a first page of pages of a memory block in response to a command and an address; a controller suitable for outputting the command and the address to detect a second page on which the program operation is performed subsequent to the first page when power is switched on after a sudden power-off is generated while the program operation is performed, and a first erase page among the pages, wherein the controller decides whether to skip the program operation on the first erase page based on the detected second page.

If the second page is an LSB page, the controller may decide to skip the program operation on the first erase page.

If the controller decides to skip the program operation on the first erase page, the controller may skip the program operation on the second page and perform the program operation on a third page on which the program operation is performed subsequent to the second page of the pages.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
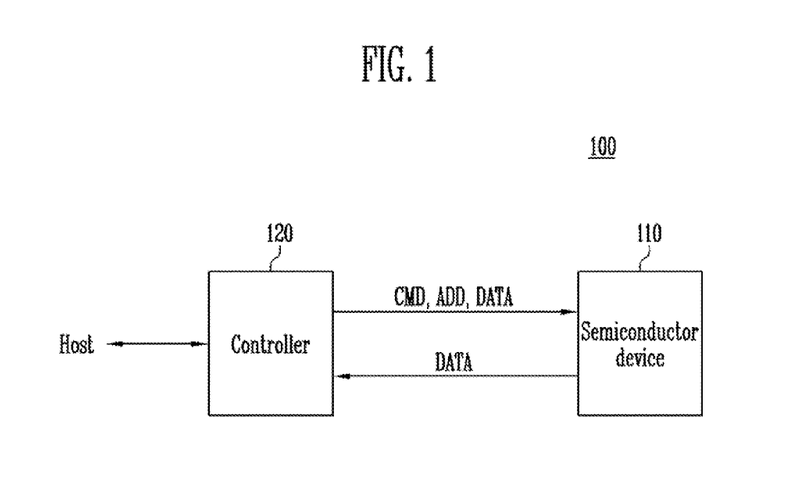
FIG. 1 is a block diagram illustrating a data storage system according to an exemplary embodiment of the present invention.
Figure 2:
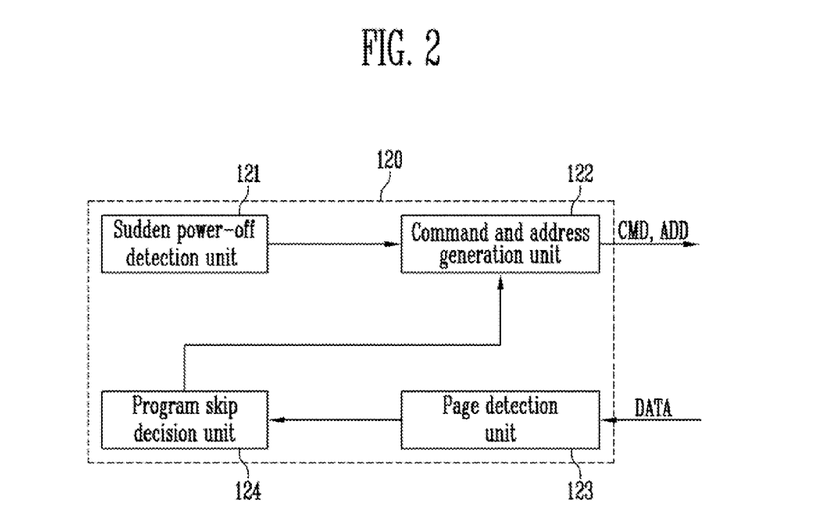
FIG. 2 is a block diagram illustrating the details of the controller shown in FIG. 1.

FIG. 1 is a block diagram illustrating a data storage system according to an exemplary embodiment of the present invention. FIG. 2 is a block diagram illustrating the details of the controller shown in FIG. 1.

Referring to FIG. 1, the data storage system 100 includes a semiconductor device 110, and a controller 120 for controlling the operation of the semiconductor device 110 according to a request from a host.

The semiconductor device 110 performs a program operation or a read operation on memory cells of pages included in a memory block in response to a command CMD and an address ADD input from the controller 120. The semiconductor device 110 programs data DATA input from the controller 120 in memory cells of a program target page, and outputs the data DATA read from the memory cells to the controller 120.

Referring to FIG. 2, the controller 120 includes a sudden power-off detection unit 121, a command and address generation unit 122, a page detection unit 123, and a program skip decision unit 124.

The sudden power-off detection unit 121 detects that a sudden power-off is generated in the data storage system 100, and generates a detection signal when power of the data storage system 100 is on.

The command and address generation unit 122 generates a command CMD and an address ADD to perform a read operation (read scan operation) on a memory block in which a program operation is suspended by the sudden power-off in response to the detection signal input from the sudden power-off detection unit 121.

The page detection unit 123 detects a first erase page, and a program target page on which a next program operation is performed subsequent to the sudden power-off among pages of a memory block in which the program operation is suspended by the sudden power-off, based on the data read from the semiconductor device 110 in the read operation. The page detection unit 123 detects a first page on which no data is stored among the pages of the memory block in which the program operation is suspended due to the sudden power-off, as the first erase page.

The program skip decision unit 124 decides whether to skip the program operation on the first erase page based on the program target page detected by the page detection unit 123.

In one embodiment, the program skip decision unit 124 decides to skip the program operation on the first erase page, when the program target page detected by the page detection unit 123 is a least significant bit (LSB) page, and not to skip the program operation on the first erase page, when the program target page detected by the page detection unit 123 is not an LSB page (is a most significant bit (MSB) page).

When the program skip decision unit 124 decides to skip the program operation on the first erase page, the command and address generation unit 122 generates the command CMD and the address ADD such that the semiconductor device 110 skips the program operation on the program target page and performs the program operation on the memory cells of a page on which a next program operation is performed subsequent to the program target page.

In another embodiment, when the program target page detected by the page detection unit 123 is the first erase page, the program skip decision unit 124 decides to skip the program operation on the first erase page. On the other hand, when the program target page detected by the page detection unit 123 is not the first erase page, the program skip decision unit 124 decides not to skip the program operation on the first erase page.

When the program skip decision unit 124 decides to skip the program operation on the first erase page, the command and address generation unit 122 generates the command CMD and the address ADD so that the semiconductor device 110 skips the program operation on the program target page and performs the program operation on the memory cells of the page on which a next program operation is performed subsequent to the program target page.

Accordingly, the data storage system 100 prevents the program operation on the unstable erase page due to the sudden power-off, and thus improves data reliability.

Figure 3:
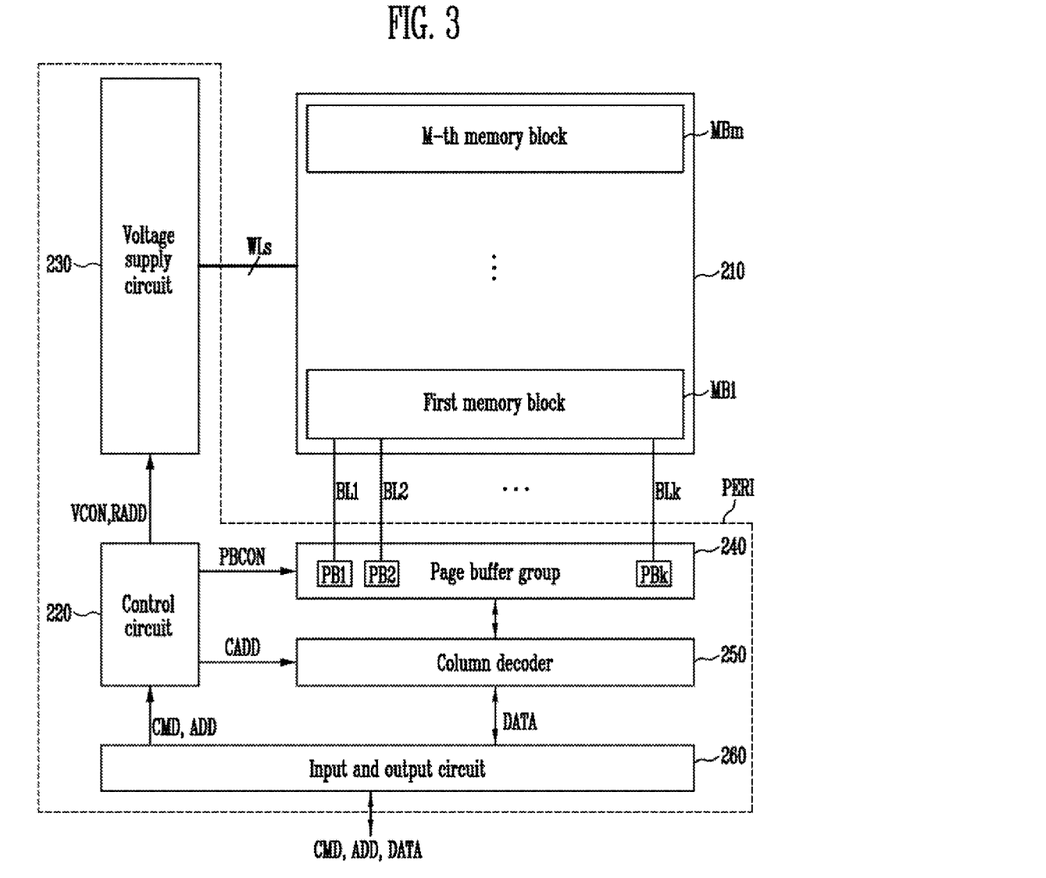
FIG. 3 is a block diagram illustrating the details of the semiconductor device shown in FIG. 1.
Figure 4:
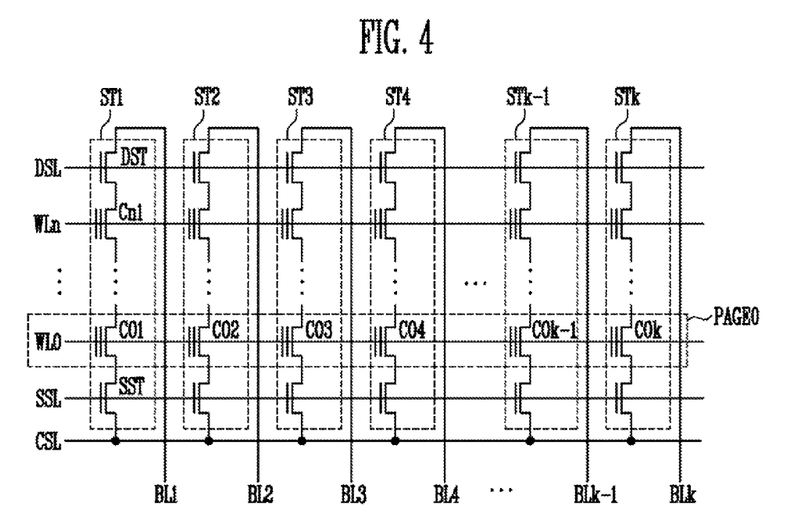
FIG. 4 is a circuit diagram illustrating the details of the memory block shown in FIG. 3.

FIG. 3 is a block diagram illustrating the details of the semiconductor device shown in FIG. 1. FIG. 4 is a circuit diagram illustrating the details of the memory block shown in FIG. 3.

Referring to FIG. 3, the semiconductor memory device according to an exemplary embodiment of the present invention includes a memory array 210 configured to include first to m-th memory blocks MB1~MBm, and a peripheral circuit PERI configured to perform a program operation and a read operation on the memory cells included in a selected page of the memory blocks MB1~MBm. The peripheral circuit PERI includes a control circuit 220, a voltage supply circuit 230, a page buffer group 240, a column decoder 250, and an input and output circuit 260.

Referring to FIG. 4, each memory block includes a plurality of strings ST1~STk connected to bit lines BL1~BLk and a common source line CSL. That is, the strings ST1~STk are connected to the bit lines BL1~BLk, respectively, and are commonly connected to the common source line CSL. Each string ST1 Includes a source select transistor SST having a source connected to the common source line CSL, a plurality of memory cells C01~Cn1, and a drain select transistor DST having a drain connected to the bit line BL1. The memory cells C01~Cn1 are serially connected between the source select transistor SST and the drain select transistor DST. A gate of the source select transistor SST is connected to the source select line SSL, gates of the memory cells C01~Cn1 are connected to word lines WL0~WLn, respectively, and a gate of the drain select transistor DST is connected to the drain select line DSL.

The memory cells included in the memory block are divided in units of physical pages or logical pages. For example, the memory cells C01~C0k connected to one word line (for example, WL0) constitute one physical page PAGE0. The page may be a basic unit of a program operation or a read operation.

The control circuit 220 outputs a voltage control signal VCON for generating a voltage required for the program operation or the read operation in response to a command CMD input through the input and output circuit 260 from the outside, and outputs a page buffer control signal PBCON for controlling page buffers PB1~PBk included in the page buffer group 240 according to the type of an operation. Further, the control circuit 220 outputs a row address RADD and a column address CADD in response to the address signal ADD input through the input and output circuit 260 from the outside.

The voltage supply circuit 230 provides operating voltages needed for a program operation, a read operation, and an erase operation for memory cells in response to the voltage control signal VCON of the control circuit 220 for local lines including a drain select line DSL, word lines WL0~WLn, and a source select line SSL of a selected memory block. The voltage supply circuit 230 includes a voltage generation circuit and a row decoder.

The voltage generation circuit outputs the operating voltages needed for the program operation, the read operation, and the erase operation for the memory cells in response to the voltage control signal VCON of the control circuit 220 to global lines.

The row decoder connects the global lines and the local lines DSL, WL0~WLn, and SSL so that the operating voltages output from the voltage generation circuit to the global lines are transferred to the local lines DSL, WL0~WLn, and SSL of the selected memory block in the memory array 210 in response to the row address RADD.

The page buffer group 240 includes the page buffers PB1~PBk connected to the memory array 210 through the bit lines BL1~BLk. The page buffers PB1~PBk of the page buffer group 240 selectively precharge the bit lines BL1~BLk according to data input to store data in the memory cells C01~C0k, or sense voltages of the bit lines BL1~BLk to read out data from the memory cells, in response to the page buffer control signal PBCON of the control circuit 220.

The column decoder 250 selects the page buffers PB1~PBk, which are included in the page buffer group 240, in response to the column address CADD output from the control circuit 220. That is, the column decoder 250 sequentially transmits data stored in the memory cells to the page buffers PB1~PBk in response to the column address signal CADD. Further, the column decoder 250 sequentially selects the page buffers PB1~PBk in response to the column address signal CADD so that data from the memory cells latched in the page buffers PB1~PBk is output to the outside by the read operation.

The input and output circuit 260 transmits data to the column decoder 250 according to control of the control circuit 220 in order to output data input from the outside to the page buffer group 240 to store memory cells in the program operation. When the column decoder 250 transmits the data input from the input and output circuit 260 to the page buffers PB1~PBk of the page buffer group 240, the page buffers PB1~PBk store the input data in an inner latch circuit. Further, the input and output circuit 260 outputs data transferred from the page buffers PB1~PBk of the page buffer group 240 through the column decoder 250 to the outside in the read operation.

Figure 5:
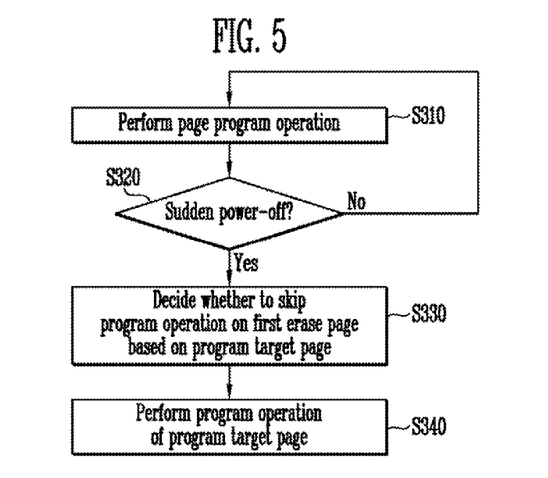
FIG. 5 is a flowchart illustrating a method of operating a data storage system according to an exemplary embodiment of the present invention.

FIG. 5 is a flowchart illustrating a method of operating a data storage system according to an exemplary embodiment of the present invention.

Referring to FIG. 5, the method of operating the data storage system includes performing a program operation on the pages of a memory block (S310). The program operation may be sequentially performed from a start page to an end page.

The method includes verifying whether a sudden power-off of the data storage system is generated (S320). When power of the data storage system is switched on after the sudden power-off is generated, the method includes deciding whether to skip a program operation on a first erase page, based on a program target page on which a next program operation is performed among the pages of a memory block in which the program operation is suspended due to the sudden power-off (S330).

The method includes performing the program operation on the next program target page (S340).

Figure 6:
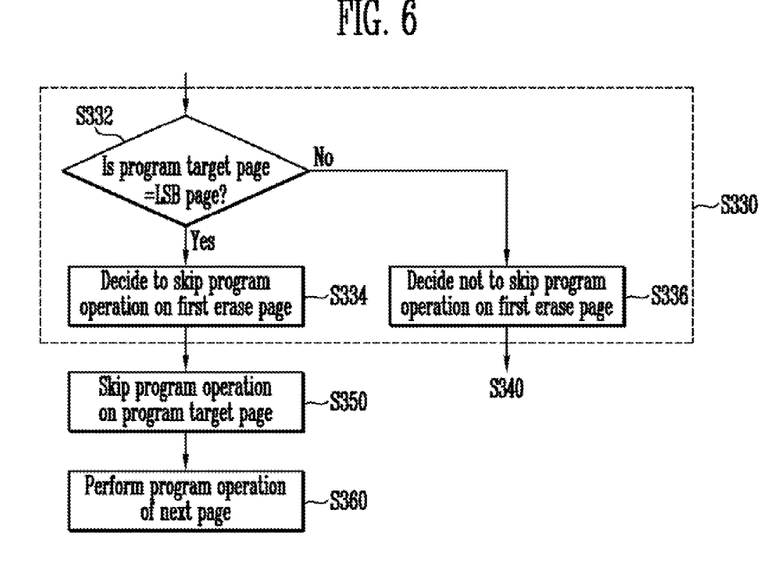
FIGS. 6 to 8 are flowcharts illustrating detailed operations for the method of operating the data storage system shown in FIG. 5.
Figure 7:
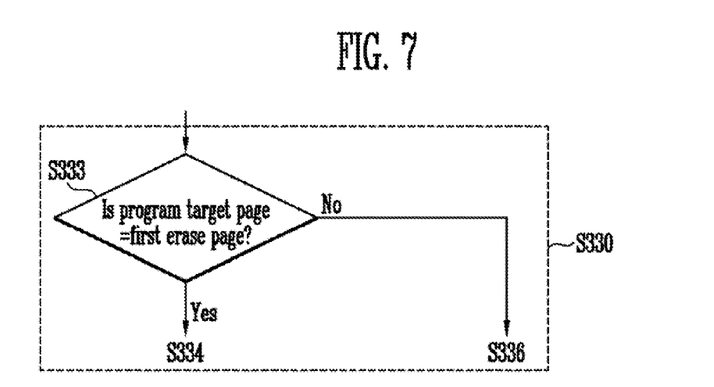
Figure 8:
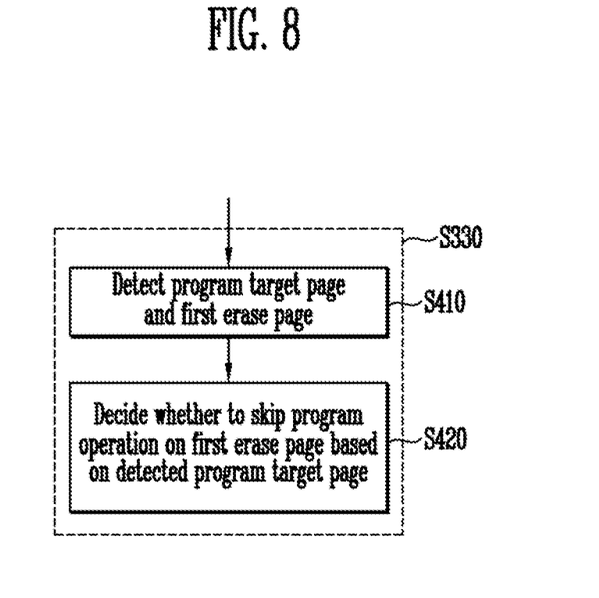

FIGS. 6 to 8 are flowcharts illustrating detailed operations for the method of operating the data storage system shown in FIG. 5.

Referring to FIG. 6, the operation S330 of deciding whether to skip the program operation on the first erase page based on the program target page includes verifying whether the program target page is an LSB page (S332).

When the program target page is an LSB page, the operation S330 includes deciding to skip the program operation on the first erase page (S334). When the program target page is not an LSB page, the operation S330 includes deciding not to skip the program operation on the first erase page (S336).

When it is decided to skip the program operation on the first erase page in the operation S334, the method includes skipping the program operation on the program target page (S350), and performing the program operation on a page on which the program operation is performed subsequent to the program target page among the pages (S360).

When it is decided not to skip the program operation on the first erase page in the operation S336, the method includes performing the program operation on the program target page (S340).

Referring to FIG. 7, the operation S330 of deciding whether to skip the program operation on the first erase page based on the program target page includes verifying that the program target page is the first erase page (S333).

When the program target page is the first erase page, the operation S330 includes deciding to skip the program operation on the first erase page (S334). When the program target page is not the first erase page, the operation S330 includes deciding not to skip the program operation on the first erase page (S336).

When it is decided to skip the program operation on the first erase page in the operation S334, the method includes skipping the program operation on the first erase page (S350), and performing the program operation on a page on which the program operation is performed subsequent to the program target page among the pages (S360).

When it is decided not to skip the program operation on the first erase page in the operation S336, the method includes performing the program operation on the program target page (S340).

Referring to FIG. 8, the operation S330 of deciding whether to skip the program operation on the first erase page based on the program target page includes detecting the first erase page and the program target page on which the program operation is performed subsequent to the sudden power-off among pages of a memory block in which the program operation is suspended due to the sudden power-off (S410). In one embodiment, the operation S330 may include detecting a first page in which no data is stored among the pages of the memory block on which the program operation is suspended due to the sudden power-off, as the first erase page.

After this, the operation S330 includes deciding whether to skip the program operation on the first erase page based on the detected program target page (S420).

Figure 9:
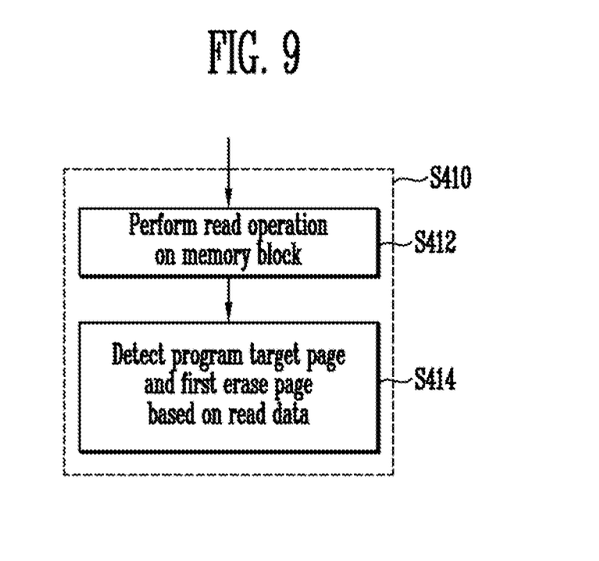
FIG. 9 is a flowchart illustrating an operation for detecting a page shown in FIG. 8.

FIG. 9 is a flowchart illustrating an operation for searching a page shown in FIG. 8.

Referring to FIG. 9, the operation S410 of detecting the first erase page and the next program target page on which the program operation is performed subsequent to the sudden power-off among the pages of the memory block in which the program operation is suspended due to the sudden power-off includes performing a read operation (read scan operation) on the memory block in which the program operation is suspended due to the sudden power-off (S412).

After this, the operation S410 includes detecting the page target page and the first erase page based on the read data (S414).

Accordingly, the method of operating the data storage system can prevent a program operation on an unstable erase page due to the sudden power-off, and thus improve data reliability.

Figure 10:
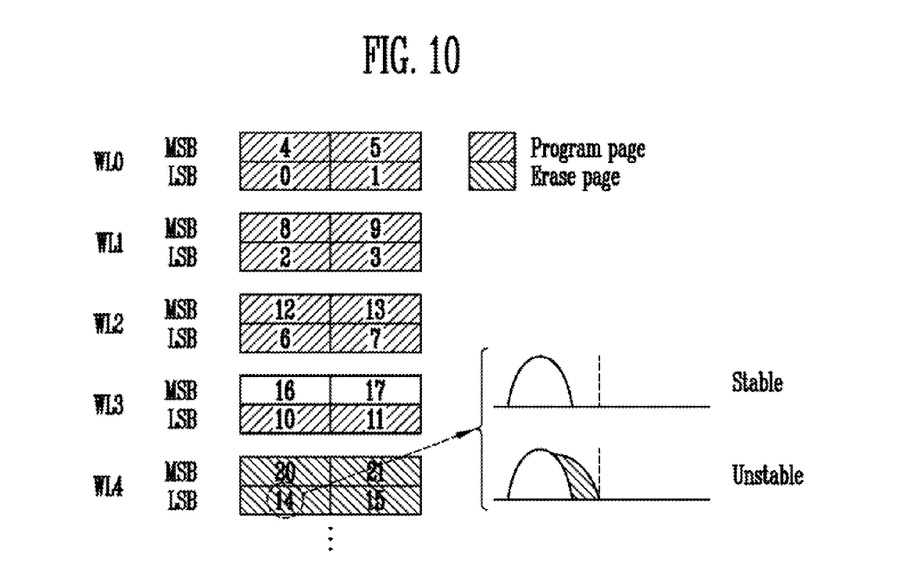
FIG. 10 is a diagram for illustrating threshold voltage distribution in a program operation after a sudden power-off.

FIG. 10 is a diagram illustrating threshold voltage distribution in a program operation after a sudden power-off. FIGS. 11 to 14 are diagrams illustrating application of a method of operating the data storage system according to an exemplary embodiment of the present invention in a two-bit multi-level cell.

Referring to FIGS. 10 to 14, an example in which even memory cells and odd memory cells among the memory cells connected to one word line are separately operated, and 2-bit data is stored in each memory cell, will be explained. That is, there is an even page, an odd page, an LSB page, and an MSB page, in one word line. This is for convenience of explanation, and the method of operating the data storage system according to an exemplary embodiment of the present invention can be applied to another example in which both the even memory cells and the odd memory cells are simultaneously operated, or 3-bit data is stored in each memory cell.

When the program operation is performed on the memory cell, the method includes controlling an operating sequence of the program operation in units of word lines to reduce movement of threshold voltage distribution due to interference. The numerals shown in FIGS. 10 to 14 illustrate the operating sequence of the program operation. For convenience, 0 to 21st pages are illustrated.

Referring to FIG. 10, the 0 page to the 13th page are program pages on which the program operation is performed, and the 14th, 15th, 20th, and 21st are erase pages on which the program is not performed (although MSB data is not stored, since the MSB program operation is not performed on the 16th and 17th pages, the 16th and 17th pages are not erase pages since the program operation is performed on the 10th and 11th pages which are LSB pages). Since a sudden power-off is generated, while the program operation is performed on the 13th page, a first erase page on which no data is stored in the memory cells, is the 14th page.

A program target page on which the program operation is sequentially performed after the sudden power-off is generated, is the 14th page, which is the LSB page. The 14th page is unstable since the threshold voltage distribution shifts to the right due to an effect of the sudden power-off generated, while the program operation is performed on the 13th page. Accordingly, it is desirable to skip the program operation on the unstable page in order to improve data reliability.

Figure 11:
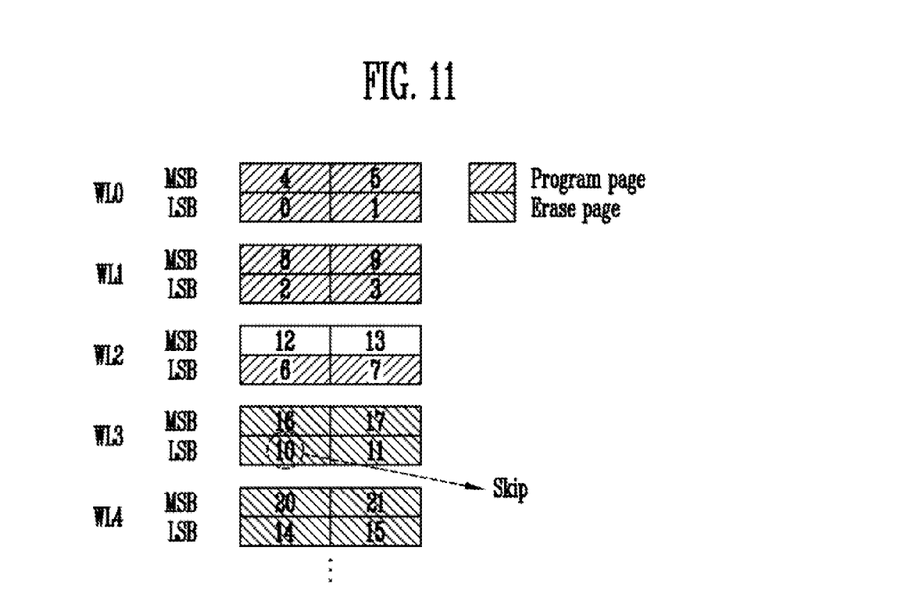
FIGS. 11 to 14 are diagrams illustrating application of a method of operating the data storage system according to an exemplary embodiment of the present invention in a two-bit multi-level cell.

Referring to FIG. 11, the 0 to 9th pages are program pages on which the program operation is performed, and the 10th, 11th, 14th, 15th, and 16th to 19th are erase pages on which the program is not performed. Since the sudden power-off is generated, while the program operation is performed on the 9th page, a first erase page on which no data is stored in the memory cells is the 10th page.

A program target page on which the program operation is sequentially performed subsequent to the sudden power-off, is the 10th page that is the LSB page. Since the 10th page is unstable due to an effect of the sudden power-off generated, while the program operation is performed on the 9th page, it is desirable to skip the program operation on the 10th page, which is the first erase page.

Figure 12:
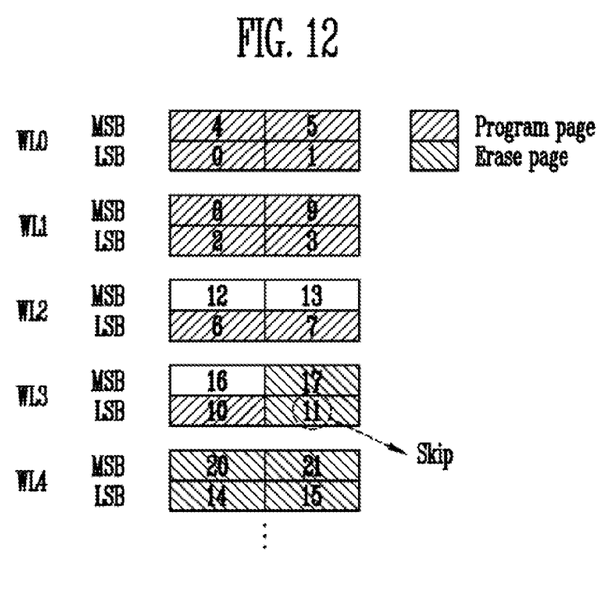

Referring to FIG. 12, the 0 to 10th pages are program pages on which the program operation is performed, and the 11th, 14th, 15th, and 17th to 19th are erase pages on which the program is not performed. Since the sudden power-off is generated, while the program operation is performed on the 10th page, a first erase page on which no data is stored in the memory cells is the 11th page.

A program target page on which the program operation is sequentially performed subsequent to the sudden power-off is the 11th page that is the LSB page. Since the 11th page is unstable due to an effect of the sudden power-off generated, while the program operation is performed on the 10th page, it is desirable to skip the program operation on the 11th page, which is the first erase page.

Figure 13:
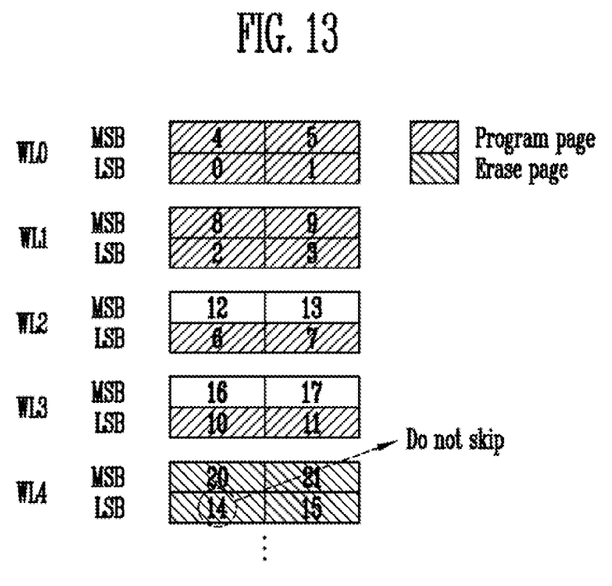

Referring to FIG. 13, the 0 to 11th pages are program pages on which the program operation is performed, and the 14th, 15th, 20th and 21st are erase pages on which the program is not performed. Since the sudden power-off is generated, while the program operation is performed on the 11th page, a first erase page on which no data is stored in memory cells is the 14th page.

A program target page on which the program operation is sequentially performed subsequent to the sudden power-off is the 12th page, which is the MSB page. Since the 14th page is not unstable due to an effect of the sudden power-off generated, while the program operation is performed on the 11th page (each of the 11th and 14th pages corresponds to different word lines), it is desirable not to skip the program operation on the 14th page, which is the first erase page.

Figure 14:
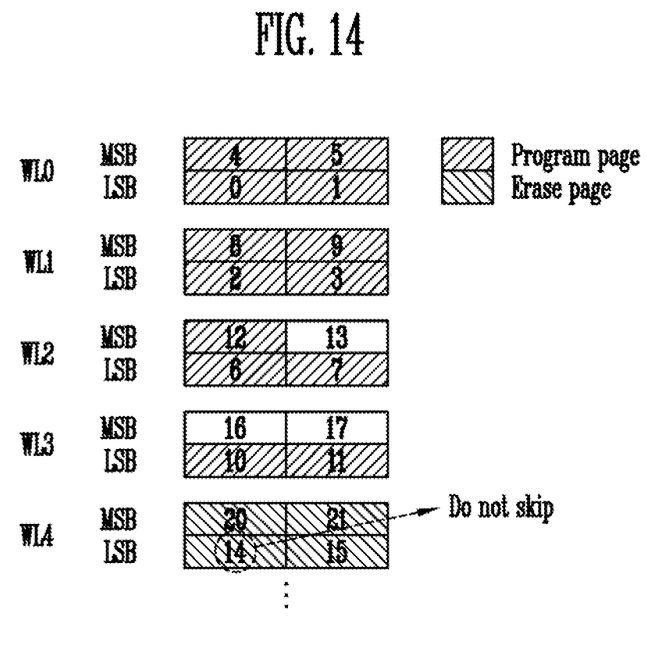

Referring to FIG. 14, the 0 to 12th pages are program pages on which the program operation is performed, and the 14th, 15th, 20th and 21st are erase pages on which the program operation is not performed. Since the sudden power-off is generated, while the program operation is performed on the 12th page, a first erase page on which no data is stored in memory cells is the 14th page.

A program target page on which the program operation is sequentially performed subsequent to the sudden power-off is the 13th page, which is the MSB page. Since the 14th page is not unstable due to an effect of the sudden power-off generated, while the program operation is performed on the 12th page (each of the 12th and 14th pages corresponds to different word lines), it is desirable not to skip the program operation on the 14th page, which is the first erase page.

Accordingly, the method of operating the data storage system can improve data reliability by preventing the program operation on the unstable erase page due to the sudden power-off.

Figure 15:
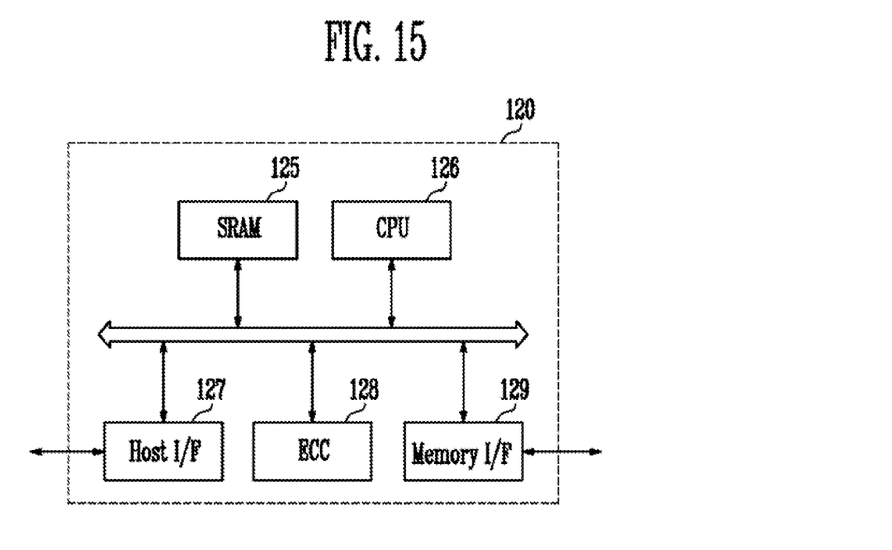
FIG. 15 is a block diagram illustrating the details of the controller shown in FIG. 1.

FIG. 15 is a block diagram illustrating the details of the controller shown in FIG. 1.

The data storage system 100 shown in FIG. 1 may be provided as a memory card or a solid state disk (SSD) by combining the semiconductor device 110 and the controller 120.

Referring to FIG. 15, the controller 120 includes a static random access memory (SRAM) 125, a central processing unit (CPU) 126, a host interface 127, an error correcting block (ECC) 128, and a memory interface 129. The SRAM 125 may be used as an operational memory for the CPU 126. The host interface 127 may include a data exchange protocol of a host connected to the data storage system 100. The ECC 128 may detect and correct an error included in a data read out from the semiconductor device 110. The memory interface 129 may interface with the semiconductor device 110 of the present invention. The CPU 126 may perform various control operations for data exchange of the controller 120.

Although not shown, the data storage system 100 further includes a ROM or the like for storing code data for interfacing with the host. The semiconductor device 110 may be a multi-chip package configured as a plurality of flash memory chips. The data storage system 100 of the present invention may lower an error generation probability and be provided as a storage medium with high reliability. Particularly, the semiconductor device of the present invention may be included in a memory system such as an SSD, which has been actively studied recently. Here, the controller 120 may be configured to communicate with the outside (for example, a host) through one of various interface protocols such as a Universal Serial Bus (USB), a Multi-Media Card (MMC), a Peripheral Component Interconnect-Express (PCI-E), a Serial Advance Technology Attachment (SATA), a Parallel Advance Technology Attachment (PATA), a Small Computer System Interface (SCSI), an Enhanced Small Device Interface (ESDI), an Integrated Drive Electronics (IDE), etc.

Figure 16:
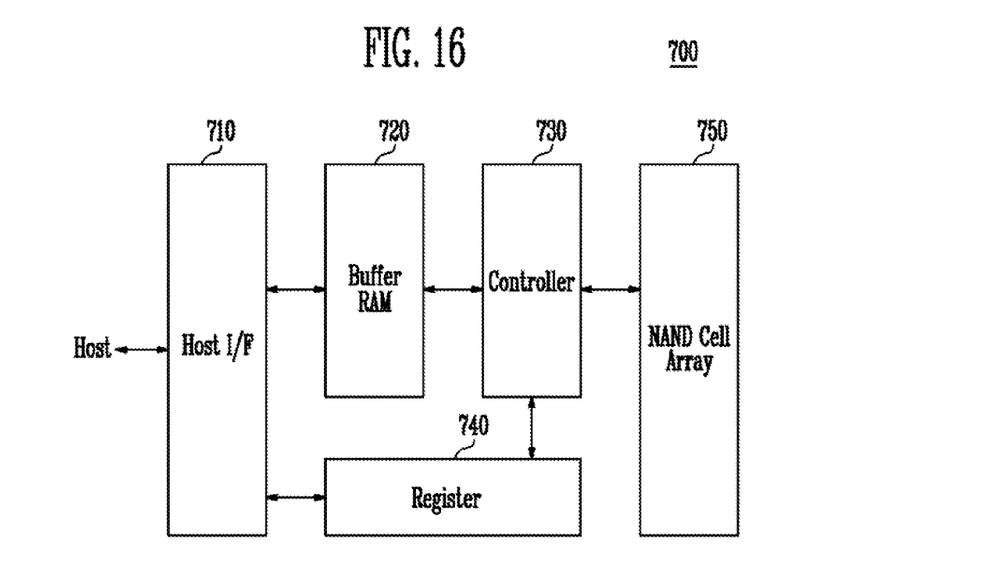
FIG. 16 is a simplified block diagram illustrating a fusion memory device or a fusion memory system performing a program operation according to various aforementioned embodiments.

FIG. 16 is a block diagram illustrating a fusion memory device or a fusion memory system performing a program operation according to the various aforementioned embodiments. For example, the present invention may be applied to a NAND flash memory device 700, as a fusion memory device.

The one NAND flash memory device 700 may include a host interface 710 for exchanging various information with an apparatus using a different protocol, a buffer RAM 720 for embedding codes to drive a memory device and temporarily storing data, a controller 730 for controlling a read operation, a program operation and every operation in response to a control signal and a command which are input from the outside, a register 740 for storing data such as a command, an address, a configuration for defining system operational environments of the inside of the memory device, and a NAND flash cell array 750 configured by an operational circuit including a non-volatile memory cell and a page buffer. The one NAND flash memory device may be programmed, as described above, in response to a write request from the host.

Figure 17:
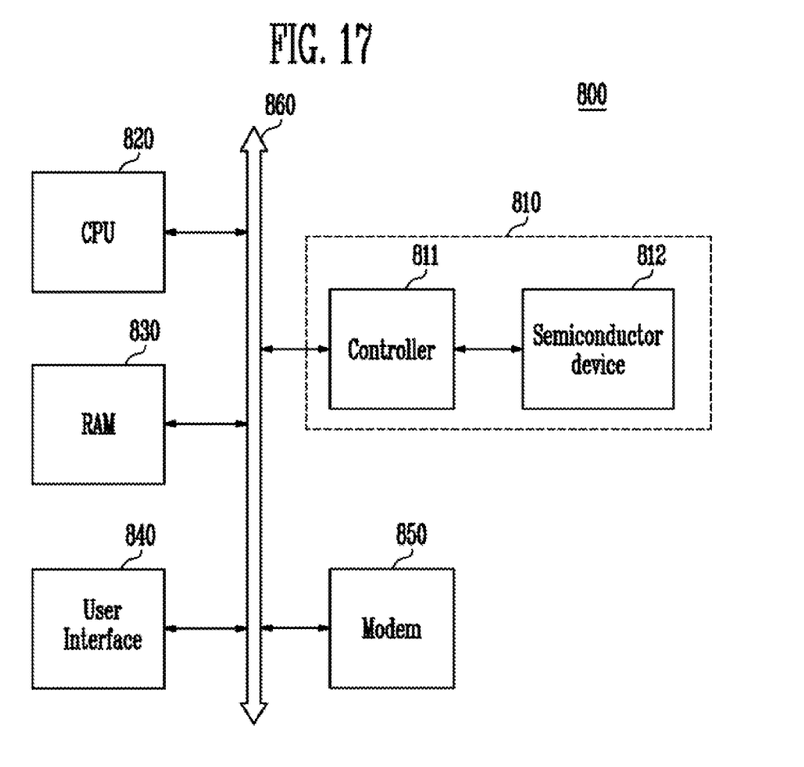
FIG. 17 is a block diagram illustrating a computing system including the semiconductor device according to an exemplary embodiment of the present invention.

FIG. 17 is a block diagram illustrating a computing system including the semiconductor device according to an exemplary embodiment of the present invention.

The computing system 800 according to the present invention may include a CPU 820, a RAM 830, a user interface 840, a modem 850 such as a baseband chipset, and a data storage system 810 including a controller 811 and a semiconductor device 812, which are connected to a system bus 860. If the computing system 800 of the present invention is a mobile apparatus, the computing system 800 may further include a battery (not shown) for providing operational voltage thereto. Although not shown, the computing system 800 may further include an application chipset, a camera image processor (CIS), a mobile DRAM, or the like. For example, the data storage system 810 may be configured as an SSD using a non-volatile memory for storing data. The data storage system 810 may also be provided as a fusion flash memory (for example, a NAND flash memory).

The embodiments of the present invention described above are implemented by not only an apparatus or method, but also a program executing functions corresponding to the configuration of the embodiments of the present invention or a recording medium on which the program is recorded. The embodiments of the present invention may be easily implemented by those of ordinary skill in the art.

The data storage system and the method of operating the same can prevent the program operation on unstable erase pages due to a sudden power-off, and thus improve data reliability.

In the drawings and specification, there have been disclosed typical exemplary embodiments of the invention, and although specific terms are employed, they are used in a generic and descriptive sense only and not for purposes of limitation. As for the scope of the invention, it is to be set forth by the following claims. Therefore, it will be understood by those of ordinary skill in the art that various changes in form and details may be made therein without departing from the spirit and scope of the present invention as defined by the following claims.

What is claimed is:

1. A method of operating a data storage system, comprising:
    performing a program operation on a first page of pages of a memory block;
    deciding, when power is switched on after a sudden power-off is generated while the program operation is performed on the first page, whether to skip the program operation on a first erase page based on a second page on which the program operation is performed subsequent to the first page; and
    performing the program operation on the second page,
    wherein the first erase page is a page on which no data is stored among the pages of the memory block where the program operation is suspended due to the sudden power-off.

2. The method of claim 1, wherein the step of deciding whether to skip the program operation on the first erase page comprises skipping the program operation on the first erase page, if the second page is an LSB page.

3. The method of claim 2, wherein, if it is decided to skip the program operation on the first erase page, the program operation on the second page is skipped, and the program operation of a third page, on which the program operation is performed subsequent to the second page of the pages, is performed.

4. The method of claim 1, wherein the step of deciding whether to skip the program operation on the first erase page comprises skipping the program operation on the first erase page, if the second page is the first erase page.

5. The method of claim 4, wherein, if it is decided to skip the program operation on the first erase page, the program operation on the second page is skipped, and the program operation of a third page, on which the program operation is performed subsequent to the second page of the pages, is performed.

6. The method of claim 1, wherein the step of deciding whether to skip the program operation on the first erase page, comprises:
    detecting a second page and the first erase page; and
    deciding whether to skip the program operation on the first erase page based on the detected second page.

7. The method of claim 6, wherein the step of detecting the second page and the first erase page, comprises:
    performing a read operation of the memory block including the first page; and
    detecting the second page and the first erase page based on the read data.

8. The method of claim 1, wherein the step of deciding whether to skip the program operation on the first erase page comprises not skipping the program operation on the first erase page, if the second page is an MSB page.

9. The method of claim 1, wherein the step of deciding whether to skip the program operation on the first erase page comprises not skipping the program operation on the first page, if the second page is not the first erase page.

10. A data storage system, comprising:
- a semiconductor device suitable for performing a program operation on a first page of pages of a memory block in response to a command and an address; and
- a controller suitable for outputting the command and the address to detect a second page on which the program operation is performed subsequent to the first page when power is switched on after a sudden power-off is generated while the program operation is performed on the first page, and a first erase page,
- wherein the controller decides whether to skip the program operation on the first erase page based on the detected second page, and
- wherein the first erase page is a page on which no data is stored among the pages of the memory block where the program operation is suspended due to the sudden power-off.

11. The system of claim 10, wherein the controller decides to skip the program operation on the first erase page, if the second page is an LSB page.

12. The system of claim 11, wherein, if the controller decides to skip the program operation on the first erase page, the controller skips the program operation on the second page and performs the program operation on a third page on which the program operation is performed subsequent to the second page of the pages.

13. The system of claim 10, wherein the controller decides to skip the program operation on the first erase page, if the second page is the first erase page.

14. The system of claim 13, wherein, if the controller decides to skip the program operation on the first erase page, the controller skips the program operation on the second page and performs the program operation on a third page on which the program operation is performed subsequent to the second page of the pages.

15. The system of claim 10, wherein the controller outputs the command and the address to perform a read operation of the memory block including the first page, when the power is switched on after the sudden power-off is generated, and detects the second page and the first erase page based on the read data.

16. The system of claim 10, wherein the controller decides not to skip the program operation on the first erase page, if the second page is an MSB page.

17. The system of claim 10, wherein the controller decides not to skip the program operation on the first page, if the second page is not the first erase page.

* * * * *